US010777666B2

(12) United States Patent
Jin

(10) Patent No.: US 10,777,666 B2
(45) Date of Patent: Sep. 15, 2020

(54) MANUFACTURING METHOD OF THIN FILM TRANSISTOR SUBSTRATE AND THIN FILM TRANSISTOR SUBSTRATE MANUFACTURED BY USING THE SAME

(71) Applicant: WUHAN CHINA STAR OPTOELECTRONICS SEMICONDUCTOR DISPLAY TECHNOLOGY CO., LTD., Wuhan (CN)

(72) Inventor: Peng Jin, Wuhan (CN)

(\*) Notice: Subject to any disclaimer, the term of this patent is extended or adjusted under 35 U.S.C. 154(b) by 0 days.

(21) Appl. No.: 16/315,637

(22) PCT Filed: Nov. 27, 2018

(86) PCT No.: PCT/CN2018/117572
§ 371 (c)(1),
(2) Date: Jan. 6, 2019

(87) PCT Pub. No.: WO2020/077741
PCT Pub. Date: Apr. 23, 2020

(65) Prior Publication Data
US 2020/0127127 A1    Apr. 23, 2020

(51) Int. Cl.
*H01L 29/66* (2006.01)
*H01L 29/40* (2006.01)
(Continued)

(52) U.S. Cl.
CPC .. *H01L 29/66969* (2013.01); *H01L 21/02181* (2013.01); *H01L 21/02282* (2013.01);
(Continued)

(58) Field of Classification Search
CPC ............. H01L 29/66969; H01L 21/477; H01L 21/02565; H01L 21/02628; H01L 29/401;
(Continued)

(56) References Cited

U.S. PATENT DOCUMENTS

2010/0144088 A1   6/2010  Oh et al.
2012/0049171 A1\*  3/2012  Fukuda ................ H01L 21/336
                                                              257/40
(Continued)

FOREIGN PATENT DOCUMENTS

CN         105609422 A      5/2016
CN         106653575 A      5/2017
CN         107256868 A     10/2017

*Primary Examiner* — Kyoung Lee

(57) ABSTRACT

A manufacturing method of a thin film transistor substrate and the thin film transistor substrate manufactured by using the manufacturing method are provided. The manufacturing method includes: providing a substrate layer, forming a gate electrode layer on the substrate layer, forming an insulating layer on the substrate layer and the gate electrode layer by using a first solution, forming a channel layer on the insulating layer by using a second solution, and forming a source/drain electrode layer on the insulating layer. The insulating layer and the channel layer are formed by processes using solution, so high vacuum equipment is not required, and production costs are reduced.

18 Claims, 5 Drawing Sheets

(51) Int. Cl.
*H01L 29/786* (2006.01)
*H01L 21/477* (2006.01)
*H01L 21/02* (2006.01)

(52) U.S. Cl.
CPC .. *H01L 21/02565* (2013.01); *H01L 21/02628* (2013.01); *H01L 21/477* (2013.01); *H01L 29/401* (2013.01); *H01L 29/7869* (2013.01); *H01L 29/78696* (2013.01)

(58) Field of Classification Search
CPC ......... H01L 21/02181; H01L 21/02282; H01L 29/7869; H01L 29/78696
See application file for complete search history.

(56) References Cited

U.S. PATENT DOCUMENTS

| | | |
|---|---|---|
| 2014/0080253 A1 | 3/2014 | Yamazaki |
| 2017/0256631 A1 | 9/2017 | Min et al. |

\* cited by examiner

MANUFACTURING METHOD OF THIN FILM TRANSISTOR SUBSTRATE AND THIN FILM TRANSISTOR SUBSTRATE MANUFACTURED BY USING THE SAME

1. FIELD OF DISCLOSURE

The present invention relates to a field of display devices and, in particular, to a manufacturing method of a thin film transistor substrate and to the thin film transistor substrate manufactured by using the manufacturing method.

2. DESCRIPTION OF RELATED ART

In conventional techniques, thin film transistors are formed on a substrate by physical vapor deposition, chemical vapor deposition, and atomic layer deposition. However, these methods require high vacuum conditions, and therefore, these methods need to use advanced equipment, which leads to high production costs.

The present invention provides a manufacturing method of a thin film transistor substrate and the thin film transistor substrate manufactured by using the same, so as to reduce production costs.

SUMMARY

The present invention provides a manufacturing method of a thin film transistor substrate, including:
providing a substrate layer;
disposing a first metal layer on the substrate layer and etching the first metal layer to form a gate electrode layer;
disposing an insulating layer on the substrate layer and the gate electrode layer, wherein disposing the insulating layer on the substrate layer and the gate electrode layer includes:
  providing a first solution;
  coating the first solution on the substrate layer and the gate electrode layer to form a first solution layer, wherein the substrate layer, the gate electrode layer and the first solution layer form a first semi-finished product; and
  performing a first thermal treatment on the first semi-finished product, in which the first solution layer forms the insulating layer, and the insulating layer is made of one or a combination of at least two of $HfAlO_x$, $HfSiO_x$ and $HfSiO_xN_y$;
disposing a channel layer on the insulating layer, wherein disposing the channel layer on the insulating layer includes:
  providing a second solution;
  coating the second solution on the insulating layer to form a second solution layer, wherein the substrate layer, the gate electrode layer, the insulating layer and the second solution layer form a second semi-finished product;
  performing a second thermal treatment on the second semi-finished product, in which the second solution layer forms a channel formation layer; and
  etching the channel formation layer to form the channel layer, the channel layer being made of one or a combination of at least two of $InZnO_x$, $HfInZnO_x$ and $InZnO_x/CuO_x$;
disposing a second metal layer on the channel layer and the insulating layer, and etching the second metal layer to form a source/drain electrode layer; and
disposing a protection layer on the channel layer.

In the manufacturing method of the thin film transistor substrate, providing the first solution includes:
providing $HfCl_4$ powder and $Al(NO_3)_3 \cdot 9H_2O$ powder; and
dissolving the $HfCl_4$ powder and the $Al(NO_3)_3 \cdot 9H_2O$ powder in ethylene glycol monomethyl ether to form an $HfAlO_x$ solution.

In the manufacturing method of the thin film transistor substrate, a mole ratio of the $HfCl_4$ powder to the $Al(NO_3)_3 \cdot 9H_2O$ powder is from 1.5:1 to 2.5:1.

In the manufacturing method of the thin film transistor substrate, a concentration of the $HfAlO_x$ solution is from 0.1 mol/L to 1.5 mol/L.

In the manufacturing method of the thin film transistor substrate, providing the second solution includes:
providing indium nitrate hydrate $(In(NO_3)_3 \cdot H_2O)$ powder and zinc acetate dihydrate $(C_4H_6O_4Zn \cdot 2H_2O)$ powder; and
dissolving the indium nitrate hydrate $(In(NO_3)_3 \cdot H_2O)$ powder and the zinc acetate dihydrate $(C_4H_6O_4Zn \cdot 2H_2O)$ powder in ethylene glycol monomethyl ether to form an $InZnO_x$ solution.

In the manufacturing method of the thin film transistor substrate, a mole ratio of the indium nitrate hydrate $(In(NO_3)_3 \cdot H_2O)$ powder to the zinc acetate dihydrate $(C_4H_6O_4Zn \cdot 2H_2O)$ powder is from 0.5:1 to 2:1.

In the manufacturing method of the thin film transistor substrate, a concentration of the $InZnO_x$ solution is from 0.1 mol/L to 1.5 mol/L.

In the manufacturing method of the thin film transistor substrate, providing the substrate layer includes:
providing a support substrate;
disposing a flexible substrate layer on the support substrate;
disposing a buffering layer on the flexible substrate layer; and
disposing a blocking layer on the buffering layer.

The present invention provides a manufacturing method of a thin film transistor substrate, the manufacturing method including:
providing a substrate layer;
disposing a first metal layer on the substrate layer, and etching the first metal layer to form a gate electrode layer;
disposing an insulating layer on the substrate layer and the gate electrode layer, wherein disposing the insulating layer on the substrate layer and the gate electrode layer includes:
  providing a first solution;
  coating the first solution on the substrate layer and the gate electrode layer to form a first solution layer, wherein the substrate layer, the gate electrode layer and the first solution layer form a first semi-finished product; and
  performing a first thermal treatment on the first semi-finished product, in which the first solution layer forms the insulating layer;
disposing a channel layer on the insulating layer, wherein disposing the channel layer on the insulating layer includes:
  providing a second solution;
  coating the second solution on the insulating layer to form a second solution layer, wherein the substrate layer, the gate electrode layer, the insulating layer and the second solution layer form a second semi-finished product;
  performing a second thermal treatment on the second semi-finished product, in which the second solution layer forms a channel formation layer; and
  etching the channel formation layer to form the channel layer; and
disposing a second metal layer on the channel layer and the insulating layer, and etching the second metal layer to form a source/drain electrode layer.

In the manufacturing method of the thin film transistor substrate, providing the first solution includes:

providing $HfCl_4$ powder and $Al(NO_3)_3 \cdot 9H_2O$ powder; and dissolving the $HfCl_4$ powder and the $Al(NO_3)_3 \cdot 9H_2O$ powder in ethylene glycol monomethyl ether to form an $HfAlO_x$ solution.

In the manufacturing method of the thin film transistor substrate, a mole ratio of the $HfCl_4$ powder to the $Al(NO_3)_3 \cdot 9H_2O$ powder is from 1.5:1 to 2.5:1.

In the manufacturing method of the thin film transistor substrate, a concentration of the $HfAlO_x$ solution is from 0.1 mol/L to 1.5 mol/L.

In the manufacturing method of the thin film transistor substrate, providing the second solution includes:

providing indium nitrate hydrate $(In(NO_3)_3 \cdot H_2O)$ powder and zinc acetate dihydrate $(C_4H_6O_4Zn \cdot 2H_2O)$ powder; and dissolving the indium nitrate hydrate $(In(NO_3)_3 \cdot H_2O)$ powder and the zinc acetate dihydrate $(C_4H_6O_4Zn \cdot 2H_2O)$ powder in ethylene glycol monomethyl ether to form an $InZnO_x$ solution.

In the manufacturing method of the thin film transistor substrate, a mole ratio of the indium nitrate hydrate $(In(NO_3)_3 \cdot H_2O)$ powder to the zinc acetate dihydrate $(C_4H_6O_4Zn \cdot 2H_2O)$ powder is from 0.5:1 to 2:1.

In the manufacturing method of the thin film transistor substrate, a concentration of the $InZnO_x$ solution is from 0.1 mol/L to 1.5 mol/L.

In the manufacturing method of the thin film transistor substrate, providing the substrate layer includes:

providing a support substrate;

disposing a flexible substrate layer on the support substrate;

disposing a buffering layer on the flexible substrate layer; and disposing a blocking layer on the buffering layer.

In the manufacturing method of the thin film transistor substrate, disposing the second metal layer on the channel layer and the insulating layer and etching the second metal layer to form the source/drain electrode layer is followed by:

disposing a protection layer on the channel layer.

The present invention provides a thin film transistor substrate, including:

a substrate layer;

a gate electrode layer disposed on the substrate layer, the gate electrode layer including a plurality of gate electrodes;

an insulating layer covering the gate electrode layer and the substrate layer, the insulating layer being made of one or a combination of at least two of $HfAlO_x$, $HfSiO_x$ and $HfSiO_xN_y$;

a channel layer disposed on the insulating layer, the channel layer including a plurality of channel structures, each channel structure being disposed over a corresponding one of the gate electrodes, the channel layer being made of one or a combination of at least two of $InZnO_x$, $HfInZnO_x$ and $InZnO_x/CuO_x$;

a source/drain electrode layer disposed on the insulating layer, the source/drain electrode layer including a plurality of source electrodes and a plurality of drain electrodes, each source electrode being disposed at one side of a corresponding one of the channel structures, each drain electrode being disposed at another side of the corresponding one of the channel structures.

The thin film transistor substrate further includes a protection layer, and the protection layer is disposed on the channel layer.

The manufacturing method of the thin film transistor substrate and the thin film transistor substrate manufactured by using the manufacturing method disclosed in the present invention have advantages as follows. The manufacturing method includes: providing a substrate layer, forming a gate electrode layer on the substrate layer, forming an insulating layer on the substrate layer and the gate electrode layer by using a first solution, forming a channel layer on the insulating layer by using a second solution, and forming a source/drain electrode layer on the insulating layer. The insulating layer and the channel layer are formed by processes using solution, so high vacuum equipment is not required and production costs are reduced.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, a person having ordinary skill in this field can obtain other figures according to these figures without an inventive work or paying the premise.

DETAILED DESCRIPTION OF EMBODIMENTS

Embodiments of the present invention will be clearly and completely described with reference to the accompanying drawings as follows. It is apparent that the described embodiments are only a part of the embodiments of the present invention, but not all of them. All other embodiments obtained by a person skilled in the art based on the embodiments of the present invention without creative efforts are within the scope of the present invention.

Figure 1:
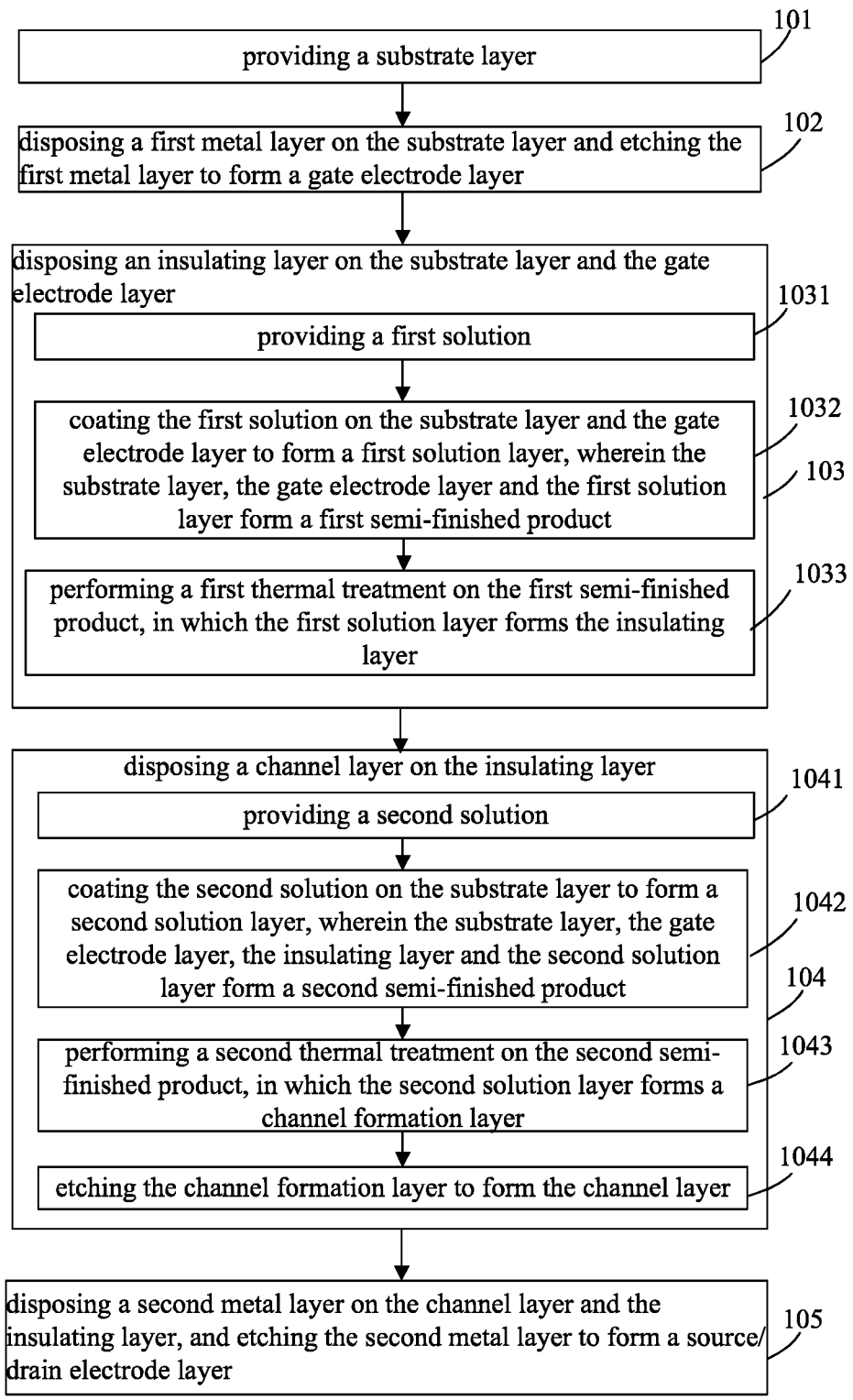
FIG. 1 is a process flow diagram illustrating a manufacturing method of a thin film transistor substrate according to the present invention.
Figure 2:
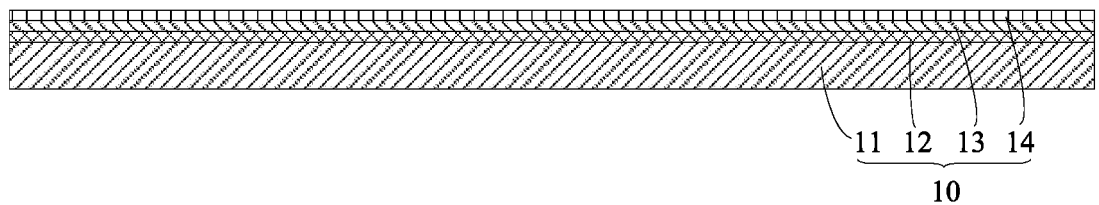
FIG. 2 is a schematic structural view illustrating a substrate layer formed by the manufacturing method of the thin film transistor substrate according to the present invention.

Please refer to FIG. 1 which is a process flow diagram illustrating a manufacturing method of a thin film transistor substrate according to the present invention. The manufacturing method of the thin film transistor substrate includes:

Step 101: as shown in FIG. 2, providing a substrate layer 10.

The substrate layer 10 includes a support substrate 11, a flexible substrate layer 12, a buffering layer 13, and a blocking layer 14.

The support substrate 11 may be a glass substrate, a plastic substrate, an aluminum oxide substrate, or other suitable substrate. The flexible substrate layer 12 may be made of polyimide. The buffering layer 13 may be made of silicon oxide. The blocking layer 14 may be made of silicon nitride. The buffering layer 13 and the blocking layer 14 can not only protect the flexible substrate layer 12, but also block and prevent impurity ions in the support substrate 11 from passing through the flexible substrate layer 12 to affect subsequent layer structures.

According to one embodiment of the present invention, Step 101 includes: first, providing the support substrate 11; next, disposing the flexible substrate layer 12 on the support substrate 11; then, disposing the buffering layer 13 on the flexible substrate layer 12; and finally, disposing the blocking layer 14 on the buffering layer 13.

Figure 3:
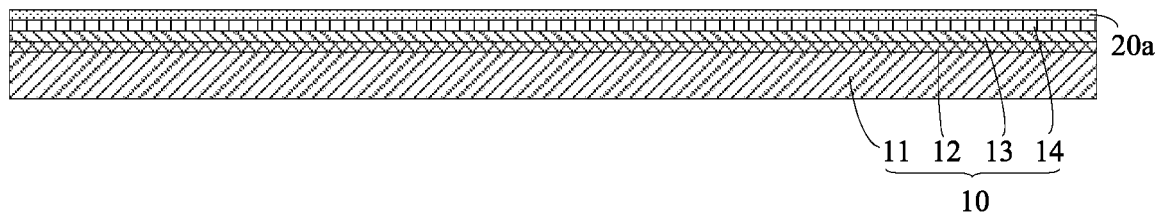
FIG. 3 is a schematic structural view illustrating the substrate layer and a first metal layer formed by the manufacturing method of the thin film transistor substrate according to the present invention.
Figure 4:
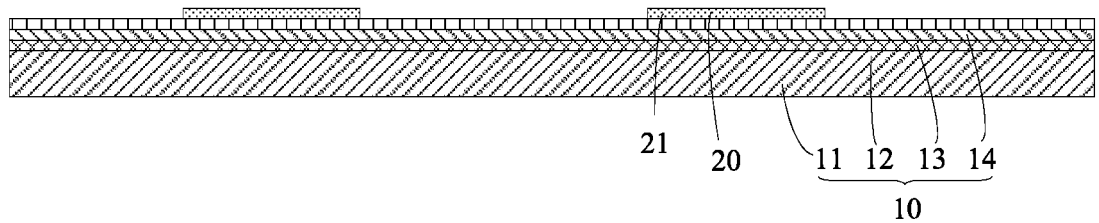
FIG. 4 is a schematic structural view illustrating the substrate layer and a gate electrode layer formed by the manufacturing method of the thin film transistor substrate according to the present invention.

Step 102: as shown in FIGS. 3 and 4, disposing a first metal layer 20a on the substrate layer 10 and etching the first metal layer 20a to form a gate electrode layer 20.

According to one embodiment of the present invention, the first metal layer 20a is made of copper. The gate electrode layer 20 includes a plurality of gate electrodes 21.

Figure 5:
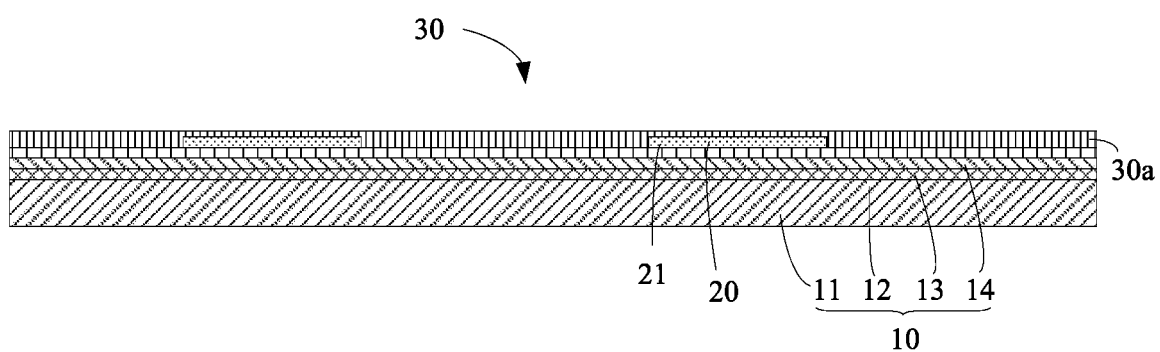
FIG. 5 is a schematic structural view illustrating a first semi-finished product formed by the manufacturing method of the thin film transistor substrate according to the present invention.
Figure 6:
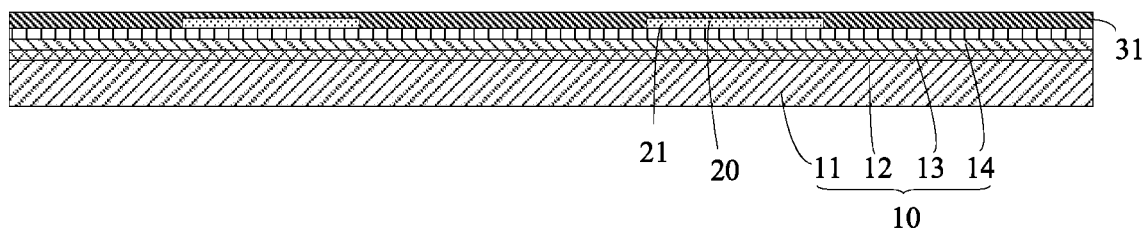
FIG. 6 is a schematic structural view illustrating the substrate layer, the gate electrode layer and an insulating layer formed by the manufacturing method of the thin film transistor substrate according to the present invention.

Step 103: as shown in FIGS. 5 and 6, disposing an insulating layer 31 on the substrate layer 10 and the gate electrode layer 20.

According to one embodiment of the present invention, disposing the insulating layer 31 on the substrate layer 10 and the gate electrode layer 20 includes:

Step 1031: providing a first solution;
Step 1032: as shown in FIG. 5, coating the first solution on the substrate layer 10 and the gate electrode layer 20 to form a first solution layer 30a, wherein the substrate layer 10, the gate electrode layer 20 and the first solution layer 30a form a first semi-finished product 30; and
Step 1033: as shown in FIG. 6, performing a first thermal treatment on the first semi-finished product 30, in which the first solution layer 30a forms the insulating layer 31.

The insulating layer 31 is made of $HfAlO_x$, $HfSiO_x$, $HfSiO_xN_y$, or other suitable material.

According to one embodiment of the present invention, the first solution is an $HfAlO_x$ solution. Preparing the HfA- lOx solution includes: first, providing $HfCl_4$ powder and $Al(NO_3)_3 \cdot 9H_2O$ powder; and then, dissolving the $HfCl_4$ powder and the $Al(NO_3)_3 \cdot 9H_2O$ powder in ethylene glycol monomethyl ether to form the $HfAlO_x$ solution. A mole ratio of the $HfCl_4$ powder to the $Al(NO_3)_3 \cdot 9H_2O$ powder is from 1.5:1 to 2.5:1. In one embodiment of the present invention, the mole ratio of the $HfCl_4$ powder to the $Al(NO_3)_3 \cdot 9H_2O$ powder is 1.8:1, 2:1, 2.2:1, or 2.4:1. A concentration of the $HfAlO_x$ solution is from 0.1 mol/L to 1.5 mol/L. In one embodiment of the present invention, the concentration of the $HfAlO_x$ solution is 0.2 mol/L, 0.35 mol/L, 0.6 mol/L, 1.2 mol/L, or 1.35 mol/L.

Figure 7:
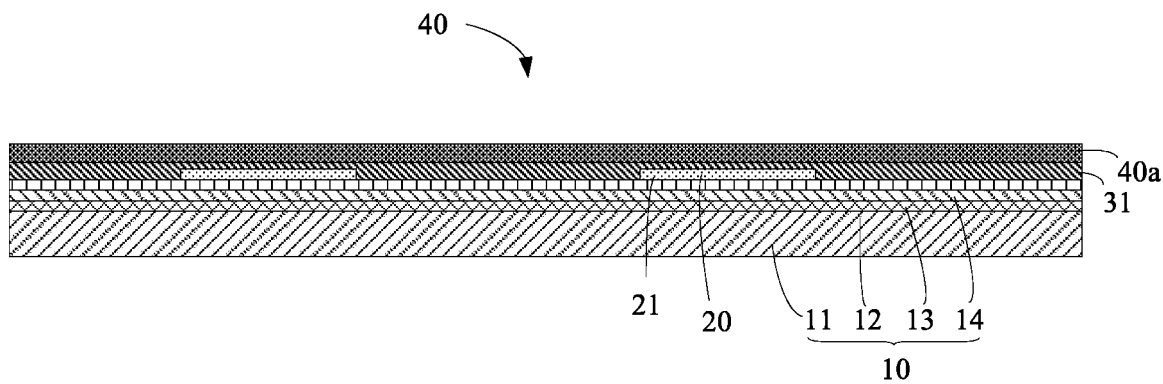
FIG. 7 is a schematic structural view illustrating a second semi-finished product formed by the manufacturing method of the thin film transistor substrate according to the present invention.
Figure 8:
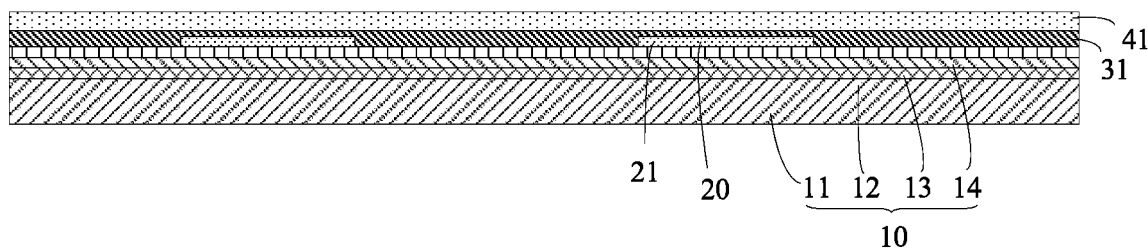
FIG. 8 is a schematic structural view illustrating the substrate layer, the gate electrode layer, the insulating layer, and a channel formation layer formed by the manufacturing method of the thin film transistor substrate according to the present invention.
Figure 9:
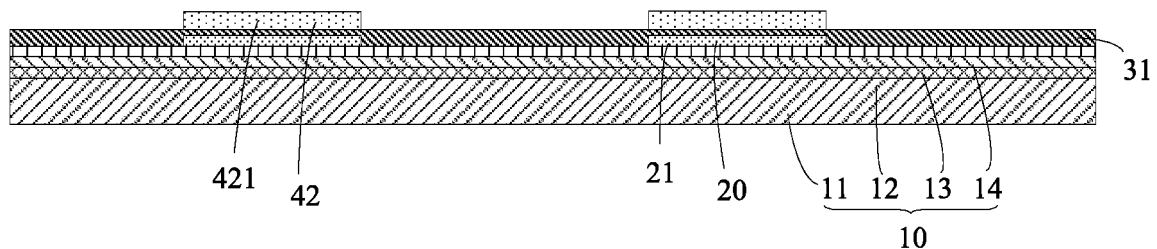
FIG. 9 is a schematic structural view illustrating the substrate layer, the gate electrode layer, the insulating layer, and a channel layer formed by the manufacturing method of the thin film transistor substrate according to the present invention.

Step 104: as shown in FIGS. 7 to 9, disposing a channel layer 42 on the insulating layer 31.

According to one embodiment of the present invention, disposing the channel layer 42 on the insulating layer 31 includes:

Step 1041: providing a second solution;
Step 1042: as shown in FIG. 7, coating the second solution on the insulating layer 31 to form a second solution layer 40a, wherein the substrate layer 10, the gate electrode layer 20, the insulating layer 31, and the second solution layer 40a form a second semi-finished product 40;
Step 1043: as shown in FIG. 8, performing a second thermal treatment on the second semi-finished product 40, in which the second solution layer 40a forms a channel formation layer 41; and
Step 1044: as shown in FIG. 9, etching the channel formation layer 41 to form the channel layer 42.

The channel layer 42 is made of $InZnO_x$, $HfInZnO_x$, $InZnO_x/CuO_x$, or other suitable material. The channel layer 42 includes a plurality of channel structures 421. Each channel structure 421 is disposed over a corresponding one of the gate electrodes 21.

According to one embodiment of the present invention, the second solution is an $InZnO_x$ solution. Preparing the $InZnO_x$ solution includes: first, providing indium nitrate hydrate $(In(NO_3)_3 \cdot H_2O)$ powder and zinc acetate dihydrate $(C_4H_6O_4Zn \cdot 2H_2O)$ powder; and then, dissolving the indium nitrate hydrate $(In(NO_3)_3 \cdot H_2O)$ powder and the zinc acetate dihydrate $(C_4H_6O_4Zn \cdot 2H_2O)$ powder in ethylene glycol monomethyl ether to form the $InZnO_x$ solution. A mole ratio of the indium nitrate hydrate $(In(NO_3)_3 \cdot H_2O)$ powder to the zinc acetate dihydrate $(C_4H_6O_4Zn \cdot 2H_2O)$ powder is from 0.5:1 to 2:1. In one embodiment of the present invention, the mole ratio of the indium nitrate hydrate $(In(NO_3)_3 \cdot H_2O)$ powder to the zinc acetate dihydrate $(C_4H_6O_4Zn \cdot 2H_2O)$ powder is 0.6:1, 0.9:1, 1.5:1, or 1.7:1. A concentration of the $InZnO_x$ solution is from 0.1 mol/L to 1.5 mol/L. In one embodiment of the present invention, the concentration of the $InZnO_x$ solution is 0.2 mol/L, 0.5 mol/L, 0.8 mol/L, or 1.2 mol/L.

Figure 10:
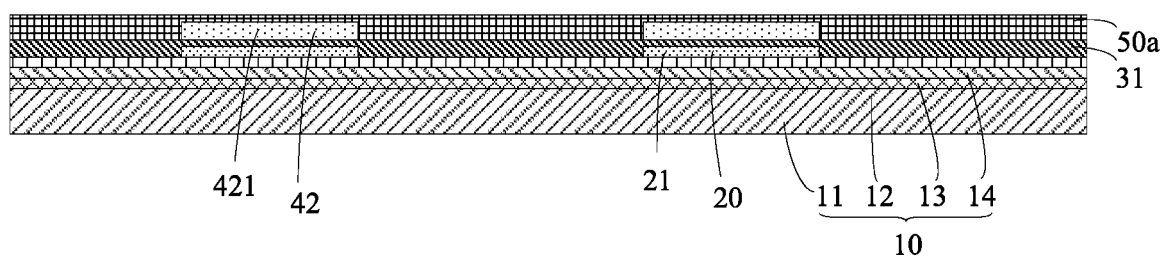
FIG. 10 is a schematic structural view illustrating the substrate layer, the gate electrode layer, the insulating layer, the channel layer, and a second metal layer formed by the manufacturing method of the thin film transistor substrate according to the present invention.
Figure 11:
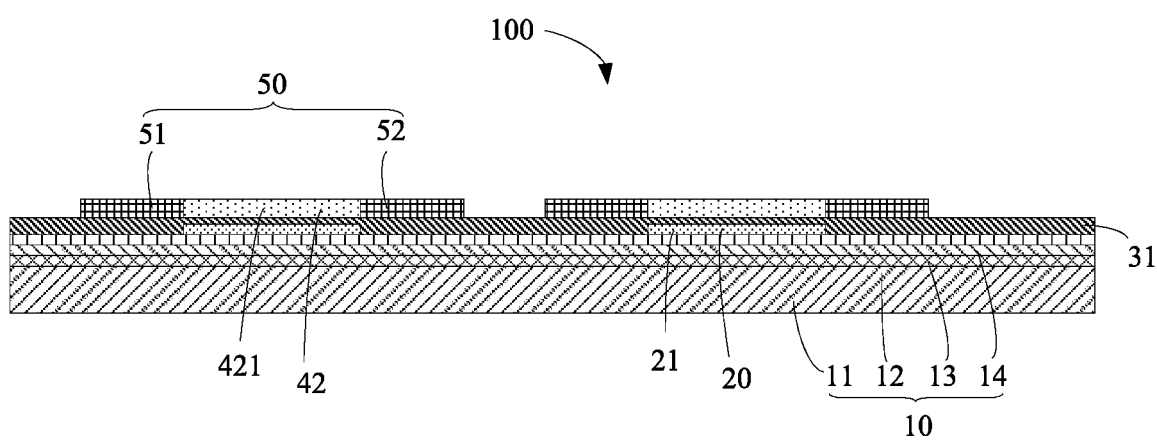
FIG. 11 is a schematic structural view illustrating the thin film transistor substrate manufactured by using the manufacturing method of the thin film transistor substrate according to a first embodiment of the present invention.

Step 105: as shown in FIGS. 10 and 11, disposing a second metal layer 50a on the channel layer 42 and the insulating layer 31, and etching the second metal layer 50a to form a source/drain electrode layer 50.

The source/drain electrode layer 50 includes a plurality of source electrodes 51 and a plurality of drain electrodes 52. At one side of each channel structure 421 is disposed one of the source electrodes 51. At another side of each channel structure 421 is disposed one of the drain electrodes 52.

Figure 12:
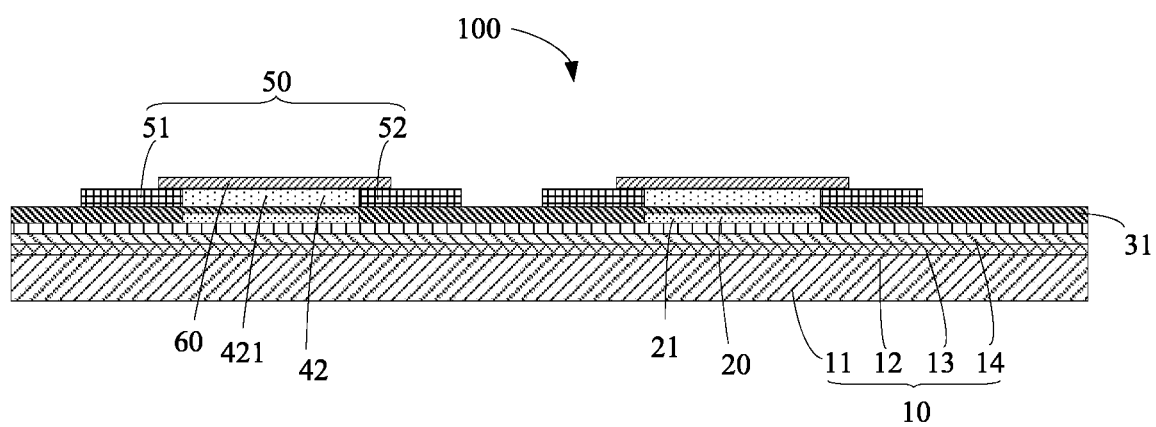
FIG. 12 is a schematic structural view illustrating the thin film transistor substrate manufactured by using the manufacturing method of the thin film transistor substrate according to a second embodiment of the present invention.

Please refer to FIG. 12, according to one embodiment of the present invention, a protection layer 60 is disposed on the channel layer 42. The protection layer 60 protects the channel layer 42 from being contaminated or oxidized.

Referring to FIG. 11, the present invention provides a thin film transistor substrate 100. The thin film transistor substrate 100 includes a substrate layer, a gate electrode layer 20, an insulating layer 31, a channel layer 42, and a source/drain electrode layer 50.

The gate electrode layer 20 is disposed on the substrate layer 10. The gate electrode layer 20 includes a plurality of gate electrodes 21. The insulating layer 31 covers the gate electrode layer 20 and the substrate layer 10. The channel layer 42 is disposed on the insulating layer 31. The channel layer 42 includes a plurality of channel structures 421. Each channel structure 421 is disposed over a corresponding one of the gate electrodes 21. The source/drain electrode layer 50 is disposed on the insulating layer 31. The source/drain electrode layer 50 includes a plurality of source electrodes 51 and a plurality of drain electrodes 52. Each source electrode 51 is disposed at one side of a corresponding one of the channel structures 421, and each drain electrode 52 is disposed at another side of the corresponding one of the channel structures 421.

Please refer to FIG. 12. According to one embodiment of the present invention, a protection layer 60 is disposed on the channel layer 42. The protection layer 60 protects the channel layer 42 from being contaminated or oxidized.

The foregoing is a detailed description of the embodiments of the present application. Principles and embodiments of the present application are set forth using specific examples. The description of the above embodiments is only for the purpose of enhancing a reader's understanding about the present invention, but not intended to be limiting. It is apparent that persons skilled in the art can modify the embodiments and the scope of the present invention according to the ideas of the present invention, so equivalent changes and modifications made in the spirit of the present invention are regarded as falling within the scope of the present invention.

What is claimed is:

1. A manufacturing method of a thin film transistor substrate, comprising:
    providing a substrate layer;
    disposing a first metal layer on the substrate layer and etching the first metal layer to form a gate electrode layer;
    disposing an insulating layer on the substrate layer and the gate electrode layer, wherein disposing the insulating layer on the substrate layer and the gate electrode layer comprises:
        providing a first solution;
        coating the first solution on the substrate layer and the gate electrode layer to form a first solution layer, wherein the substrate layer, the gate electrode layer and the first solution layer form a first semi-finished product; and
        performing a first thermal treatment on the first semi-finished product, in which the first solution layer forms the insulating layer, and the insulating layer is made of one or a combination of at least two of HfAlOx, HfSiOx and HfSiOxNy;
    disposing a channel layer on the insulating layer, wherein disposing the channel layer on the insulating layer comprises:
        providing a second solution;
        coating the second solution on the insulating layer to form a second solution layer, wherein the substrate layer, the gate electrode layer, the insulating layer, and the second solution layer form a second semi-finished product;
        performing a second thermal treatment on the second semi-finished product, in which the second solution layer forms a channel formation layer; and
        etching the channel formation layer to form the channel layer, the channel layer being made of one or a combination of at least two of InZnOx, HfInZnOx and InZnOx/CuOx;
    disposing a second metal layer on the channel layer and the insulating layer, and etching the second metal layer to form a source/drain electrode layer; and
    disposing a protection layer on the channel layer.

2. The manufacturing method of the thin film transistor substrate according to claim 1, wherein providing the first solution comprises:
    providing HfCl4 powder and Al(NO3)3.9H2O powder; and
    dissolving the HfCl4 powder and the Al(NO3)3.9H2O powder in ethylene glycol monomethyl ether to form an HfAlOx solution.

3. The manufacturing method of the thin film transistor substrate according to claim 2, wherein a mole ratio of the HfCl4 powder to the Al(NO3)3.9H2O powder is from 1.5:1 to 2.5:1.

4. The manufacturing method of the thin film transistor substrate according to claim 3, wherein a concentration of the HfAlOx solution is from 0.1 mol/L to 1.5 mol/L.

5. The manufacturing method of the thin film transistor substrate according to claim 1, wherein providing the second solution comprises:
    providing indium nitrate hydrate (In(NO3)3.H2O) powder and zinc acetate dihydrate (C4H6O4Zn.2H2O) powder; and
    dissolving the indium nitrate hydrate (In(NO3)3.H2O) powder and the zinc acetate dihydrate (C4H6O4Zn.2H2O) powder in ethylene glycol monomethyl ether to form an InZnOx solution.

6. The manufacturing method of the thin film transistor substrate according to claim 5, wherein a mole ratio of the indium nitrate hydrate (In(NO3)3.H2O) powder to the zinc acetate dihydrate (C4H6O4Zn.2H2O) powder is from 0.5:1 to 2:1.

7. The manufacturing method of the thin film transistor substrate according to claim 6, wherein a concentration of the InZnOx solution is from 0.1 mol/L to 1.5 mol/L.

8. The manufacturing method of the thin film transistor substrate according to claim 1, wherein providing the substrate layer comprises:
    providing a support substrate;
    disposing a flexible substrate layer on the support substrate;
    disposing a buffering layer on the flexible substrate layer; and
    disposing a blocking layer on the buffering layer.

9. A manufacturing method of a thin film transistor substrate, comprising:
    providing a substrate layer;
    disposing a first metal layer on the substrate layer, and etching the first metal layer to form a gate electrode layer;
    disposing an insulating layer on the substrate layer and the gate electrode layer, wherein disposing the insulating layer on the substrate layer and the gate electrode layer comprises:
        providing a first solution;
        coating the first solution on the substrate layer and the gate electrode layer to form a first solution layer, wherein the substrate layer, the gate electrode layer and the first solution layer form a first semi-finished product; and performing a first thermal treatment on the first semi-finished product, in which the first solution layer forms the insulating layer;

disposing a channel layer on the insulating layer, wherein disposing the channel layer on the insulating layer comprises:

providing a second solution;

coating the second solution on the insulating layer to form a second solution layer, wherein the substrate layer, the gate electrode layer, the insulating layer and the second solution layer form a second semi-finished product;

performing a second thermal treatment on the second semi-finished product, in which the second solution layer forms a channel formation layer; and etching the channel formation layer to form the channel layer; and disposing a second metal layer on the channel layer and the insulating layer, and etching the second metal layer to form a source/drain electrode layer, wherein providing the first solution comprises:

providing $HfCl_4$ powder and $Al(NO_3)_3.9H_2O$ powder; and dissolving the $HfCl_4$ powder and the $Al(NO_3)_3.9H_2O$ powder in ethylene glycol monomethyl ether to form an HfAlOx solution.

10. The manufacturing method of the thin film transistor substrate according to claim 9, wherein a mole ratio of the $HfCl_4$ powder to the $Al(NO_3)_3.9H_2O$ powder is from 1.5:1 to 2.5:1.

11. The manufacturing method of the thin film transistor substrate according to claim 10, wherein a concentration of the HfAlOx solution is from 0.1 mol/L to 1.5 mol/L.

12. The manufacturing method of the thin film transistor substrate according to claim 9, wherein providing the second solution comprises:

providing indium nitrate hydrate $(In(NO_3)_3.H_2O)$ powder and zinc acetate dihydrate $(C_4H_6O_4Zn.2H_2O)$ powder; and dissolving the indium nitrate hydrate $(In(NO_3)_3.H_2O)$ powder and the zinc acetate dihydrate $(C_4H_6O_4Zn.2H_2O)$ powder in ethylene glycol monomethyl ether to form an InZnOx solution.

13. The manufacturing method of the thin film transistor substrate according to claim 12, wherein a mole ratio of the indium nitrate hydrate $(In(NO_3)_3.H_2O)$ powder to the zinc acetate dihydrate $(C_4H_6O_4Zn.2H_2O)$ powder is from 0.5:1 to 2:1.

14. The manufacturing method of the thin film transistor substrate according to claim 12, wherein a concentration of the InZnOx solution is from 0.1 mol/L to 1.5 mol/L.

15. The manufacturing method of the thin film transistor substrate according to claim 9, wherein providing the substrate layer comprises:

providing a support substrate;

disposing a flexible substrate layer on the support substrate;

disposing a buffering layer on the flexible substrate layer; and disposing a blocking layer on the buffering layer.

16. The manufacturing method of the thin film transistor substrate according to claim 9, wherein disposing the second metal layer on the channel layer and the insulating layer and etching the second metal layer to form the source/drain electrode layer is followed by:

disposing a protection layer on the channel layer.

17. A thin film transistor substrate, comprising:

a substrate layer;

a gate electrode layer disposed on the substrate layer, the gate electrode layer comprising a plurality of gate electrodes;

an insulating layer covering the gate electrode layer and the substrate layer, the insulating layer being made of one or a combination of at least two of HfAlOx, HfSiOx and HfSiOxNy;

a channel layer disposed on the insulating layer, the channel layer comprising a plurality of channel structures, each channel structure being disposed over a corresponding one of the gate electrodes, the channel layer being made of one or a combination of at least two of InZnOx, HfInZnOx and InZnOx/CuOx;

a source/drain electrode layer disposed on the insulating layer, the source/drain electrode layer comprising a plurality of source electrodes and a plurality of drain electrodes, each source electrode being disposed at one side of a corresponding one of the channel structures, each drain electrode being disposed at another side of the corresponding one of the channel structures.

18. The thin film transistor substrate according to claim 17, further comprising a protection layer, the protection layer being disposed on the channel layer.

* * * * *